(12) United States Patent
Lee et al.

(10) Patent No.: US 7,419,848 B2
(45) Date of Patent: Sep. 2, 2008

(54) COMPOUND HAVING ANCHORING GROUP, ELECTRONIC DEVICE COMPRISING THE COMPOUND, AND METHODS OF PRODUCING THEM

(75) Inventors: Hyoyoung Lee, Daejeon (KR); Hyeon-jeong Do, Daejeon (KR); Do Hyun Kim, Daejeon (KR); Taehyoung Zyung, Daejeon (KR); Kun Jun, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 614 days.

(21) Appl. No.: 11/177,176

(22) Filed: Jul. 8, 2005

(65) Prior Publication Data

US 2006/0097248 A1 May 11, 2006

(30) Foreign Application Priority Data

Nov. 10, 2004 (KR) .................. 10-2004-0091576

(51) Int. Cl.
*H01L 29/08* (2006.01)
*H01L 51/40* (2006.01)
*C07D 311/82* (2006.01)
*C07D 311/90* (2006.01)

(52) U.S. Cl. .................. 438/99; 257/40; 257/E51.02; 549/388

(58) Field of Classification Search ............. 549/338; 257/40, E51.02; 438/99
See application file for complete search history.

(56) References Cited

U.S. PATENT DOCUMENTS 4,652,894 A   3/1987   Potember et al.

OTHER PUBLICATIONS

"Large Conductance Switching and Binary Operation in Organic Devices: Role of Functional Groups", A. Bandhopadhyay, et al, J. Phys. Chem B 2003, 107, pp. 2531-2536.
Large conductance switching and memory effects in organic molecules for data-storage applications, Applied Physics Letters, vol. 82, No. 8, Feb. 24, 2003, pp. 1215-1217.
"Tuning of Organic Reversible Switching via Self-Assembled Supramolecular Structures", A. Bandyopadhyay, et al., Adv. Mater. 2003, No. 22, Nov. 17, pp. 1949-1952.

*Primary Examiner*—Bernard Dentz
(74) *Attorney, Agent, or Firm*—Blakely, Sokoloff, Taylor & Zafman LLP (57) ABSTRACT

Provided are compounds having a thiol group as an anchoring group introduced into a Rose Bengal molecule, a method of producing the compound, an electronic device comprising the compound immobilized on an electrode by a self-assembling method, and a method of manufacturing the electronic device. The compound has the following formula:

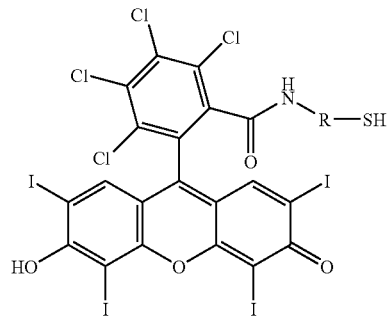

wherein
R is an unsaturated or saturated $C_2$-$C_{20}$ hydrocarbon group.

The compound can provide switch/memory properties and form a single molecular layer by self-assembling when manufacturing a molecular electronic device.

16 Claims, 8 Drawing Sheets

COMPOUND HAVING ANCHORING GROUP, ELECTRONIC DEVICE COMPRISING THE COMPOUND, AND METHODS OF PRODUCING THEM

BACKGROUND OF THE INVENTION

This application claims the benefit of Korean Patent Application No. 10-2004-0091576, filed on Nov. 10, 2004, in the Korean Intellectual Property Office, the disclosure of which is incorporated herein in its entirety by reference.

1. Field of the Invention

The present invention relates to a compound for use in electronic devices, a method of producing the compound, an electronic device comprising a layer composed of the compound, and a method of manufacturing the electronic device, and more particularly, to a compound for use in electronic devices which is derived from a Rose Bengal molecule having switching/memory properties, a method of producing the compound, an electronic device comprising a layer composed of the compound, and a method of manufacturing the electronic device.

2. Description of the Related Art

It has been recently discovered that organic materials having π-electrons that form conjugate bonds have semiconducting properties and considerable research is being conducted to develop such organic semiconductor materials. Research on organic semiconductor materials has been primarily related to electron transportation. Also, vigorous research is being conducted to apply such materials to molecular switch/memory devices using a charging phenomenon that occurs due to the polarization of π-electrons in the molecules. It has been reported that a molecular device manufactured by spin coating Rose Bengal molecules, which are used as organic coloring agents, has a molecular memory property. However, the molecular film produced by spin coating is composed of up to several tens of molecular layers, and the thickness of the molecular film is at least several tens of nanometers. Thus, an ultra-thin film cannot be easily produced and it is almost impossible to control the thickness of the film.

SUMMARY OF THE INVENTION

The present invention provides a compound which is useful for electronic devices, has an anchoring group and can be selectively immobilized as a single molecular layer on a metal electrode, and thus, can be suitably used to manufacture a molecular electronic device comprising an ultra-thin film composed of a single molecular layer.

The present invention also provides a method of producing the compound that is useful for electronic devices, has an anchoring group and can be selectively immobilized on a metal electrode.

The present invention further provides an electronic device in which a single molecular layer having functional organic molecules arranged in a predetermined direction is interposed between a lower electrode and an upper electrode to provide switching/memory properties.

The present invention further provides a method of manufacturing an electronic device in which the thickness of a functional organic molecular layer interposed between a lower electrode and an upper electrode can be easily controlled to produce an ultra-thin electronic device.

According to an aspect of the present invention, there is provided a compound for use in electronic devices, having the following formula:

wherein

R is an unsaturated or saturated $C_2$-$C_{20}$ hydrocarbon group.

In the above formula, R may be an alkyl group or an alkene group.

The compound for use in electronic devices may be a compound having the following formula:

wherein n is an integer from 2 to 20.

According to another aspect of the present invention, there is provided a method of producing a compound for use in electronic devices, comprising:

reacting Rose Bengal having the following formula with thionyl chloride to obtain an acyl chloride intermediate; and coupling the acyl chloride intermediate with a thiol compound to obtain a compound having the following formula:

wherein

R is an unsaturated or saturated $C_2$-$C_{20}$ hydrocarbon group.

The coupling the acyl chloride intermediate with the thiol compound may be performed under a basic atmosphere. For example, a pyridine-based solvent may be used in the coupling of the acyl chloride intermediate with the thiol compound.

According to still another aspect of the present invention, there is provided an electronic device comprising: a first electrode; a self-assembled molecular layer composed of the above compound for use in electronic devices selectively immobilized on the first electrode by self-assembling; and a second electrode formed on the self-assembled molecular layer.

The electronic device may constitute a memory device or a switching device.

According to yet another aspect of the present invention, there is provided a method of manufacturing of an electronic device, comprising forming a first electrode on a substrate; preparing a solution of the above compound for use in electronic devices dissolved in a solvent; dipping the substrate having the first electrode formed thereon into the obtained solution to form a self-assembled molecular layer on the first electrode; and forming a second electrode on the self-assembled molecular layer.

A compound according to an embodiment of the present invention can be used to form a single molecular layer on an electrode in a self-assembling manner and realize switch/memory devices. The single molecular layer can be ultra-thin with a thickness of about several nanometers. The thickness of the single molecular layer composed of the compound according to an embodiment of the present invention can be controlled by varying the length of a substituent of the compound. An electronic device comprising the single molecular layer produced in a self-assembling manner according to an embodiment of the present invention has switching/memory properties, and thus, a practical molecular device can be manufactured.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A compound for use in electronic devices according to an embodiment of the present invention can be used to form a single molecular layer on a surface of an electrode such that the compound can be suitably used to manufacture an electronic device which provides switching/memory properties. The compound for use in electronic devices contains an anchoring group which can be selectively attached to the surface of the electrode so as to form a single molecular layer in which each of the molecules is arranged in a predetermined direction.

The compound for use in electronic devices according to an embodiment of the present invention has formula 1, in which an anchoring group containing a mercapto group is introduced into the position of a carboxyl group (—COOH) in Rose Bengal:

(1)

wherein

R is an unsaturated or saturated $C_2$-$C_{20}$ hydrocarbon group, and preferably an alkyl group or an alkene group.

The compound for use in electronic devices may be a 2,3,4,5-tetrachloro-6-(6-hydroxy-2,4,5,7-tetraiodo-3-oxo-3H-xanthene-9-yl)-N-(n-mer capto-alkyl)-benzamide derivative represented by formula 2:

(2)

wherein n is an integer from 2 to 20.

The inventors of the present invention conducted research and introduced an alkyl- or alkene-thiol group into the position of the carboxyl group (—COOH) of Rose Bengal via an amide group.

Figure 1:
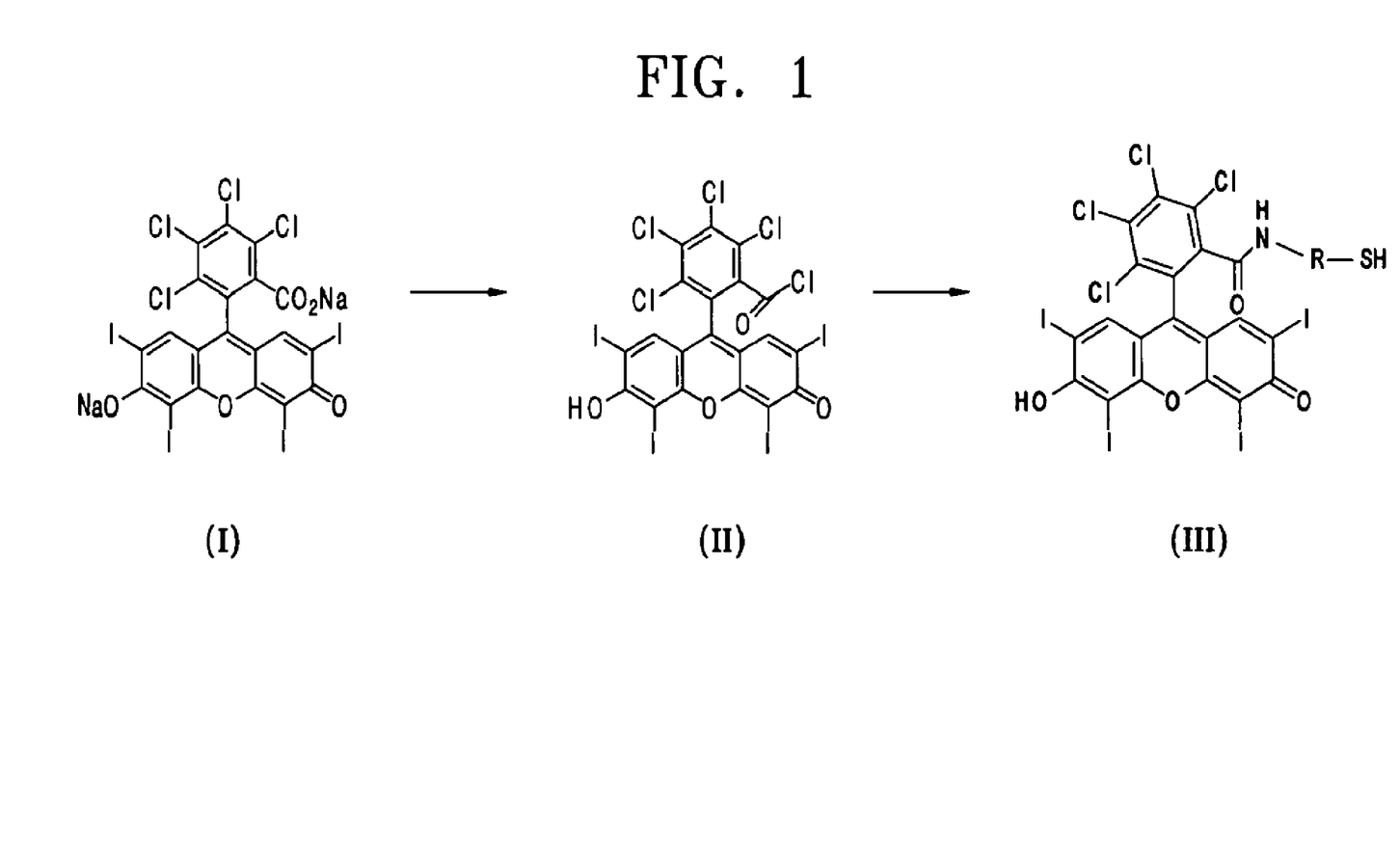
FIG. 1 is a chemical scheme illustrating a process of producing a compound for use in electronic devices according to an embodiment of the present invention.

FIG. 1 is a chemical scheme illustrating a process of producing a compound for use in electronic devices according to an embodiment of the present invention.

Referring to FIG. 1, Rose Bengal (I) is reacted with thionyl chloride to obtain an acyl chloride intermediate (II). Then, the acyl chloride intermediate (II) is coupled with a thiol compound, for example, aminoalkanethiol, to obtain a compound (III) represented by the above formula 1. In the compound (III) illustrated in FIG. 1, R is as described above.

In order to efficiently manufacture molecular devices, an immobilizing technique that can allow organic molecules in an active layer to be arranged in a single molecular layer such that the organic molecules have a specific function is considered to be critical. In an embodiment of the present invention, in order to selectively attach a functional molecule which can provide switching/memory properties to a metal electrode of an electronic device in a self-assembling manner, a compound having a specific functional group (alligator clip) (see David W. Price, Jr., Shawn M. Dirk, Francisco Maya, James M. Tour, Tetrahedron 59 (2003) 2497-2518) is introduced into a specific position of the functional molecule. For example, alkyl thiol, which is a specific functional group, can function as an anchoring group for the metal electrode.

Figure 2:
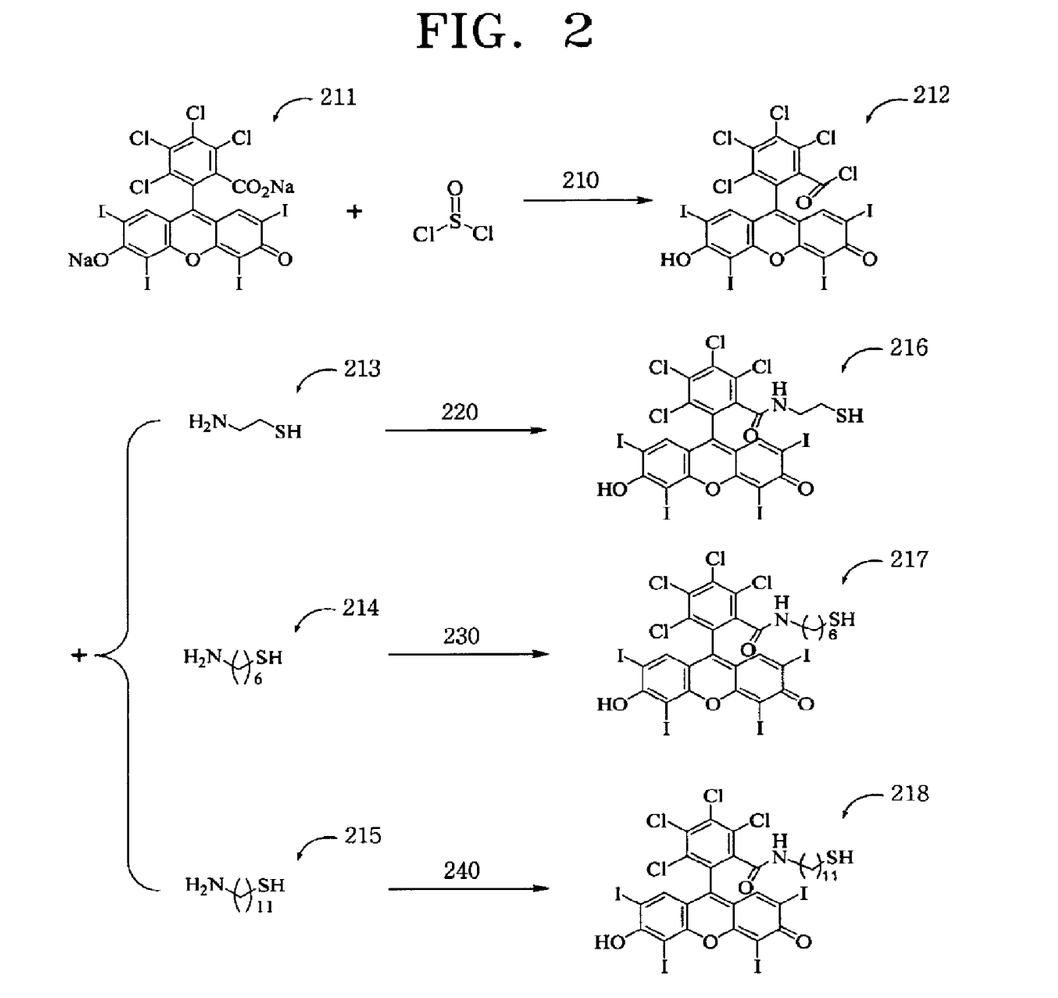
FIG. 2 is a chemical scheme illustrating synthesis of compounds according to embodiments of the present invention.

FIG. 2 is a chemical scheme illustrating synthesis of Rose Bengal derivatives having a thiol group according to an embodiment of the present invention.

Referring to FIG. 2, to introduce an anchoring group into a position of a carboxyl group in Rose Bengal 211, the carboxyl group must be activated. Although many methods of activating a carboxyl group are known, in the present embodiment, the Rose Bengal 211 is reacted with thionyl chloride to obtain an acyl chloride intermediate 212. It has been confirmed that it is very important to efficiently remove hydrogen chloride (HCl) formed as a side product of the activation reaction. Due to an excess amount of HCl or hydrochloric acid, Rose Bengal 211 is substituted with a hydrogen ion, and thus, a phenomenon by which a red color disappears, i.e., bleaching, occurs. To overcome this problem, a minimum amount of thionyl chloride as a solvent that can dissolve Rose Bengal 211 should be used. For a coupling reaction, aminoalkanethiol is used. An aminoalkanethiol compound 213 was available from Aldrich, and aminoalkanethiol compounds 214 and 215 were prepared conventionally (Journal of organic chemistry, 1999, 64, 2903-2909). To prevent the bleaching due to the acid, the coupling reaction is performed under a basic atmosphere.

A pyridine-based solvent is used as a reaction solvent to dissolve the aminoalkanethiol compounds 213, 214, and 215. The pyridine-based solvent can maintain the basic condition necessary for the coupling reaction. There are not many solvents that can dissolve the aminoalkanethiol compounds 213, 214, and 215 and even the pyridine-based solvent can only dissolve the aminoalkanethiol compounds very slowly. The pyridine-based solvent used is an anhydrous solvent. In general, as alkyl groups in the aminoalkanethiol compounds 213, 214, and 215 become longer, the reaction time increases. The coupling reaction is performed for about 2-3 days. Thus, the desired compounds 216, 217, and 218 are obtained. The desired compounds 216, 217, and 218 are confirmed using hydrogen/carbon NMR and/or mass spectrometry (MALDI-TOF). Detailed descriptions will be provided later.

In an embodiment of the present invention, an electronic device manufactured by forming and immobilizing a single molecular layer on a lower electrode using a compound according to the embodiment of the present invention and depositing an upper electrode on the immobilized single molecular layer is provided. That is, an ultra-thin film comprised of at least one organic molecular layer is interposed between the lower electrode and the upper electrode.

Figure 3:
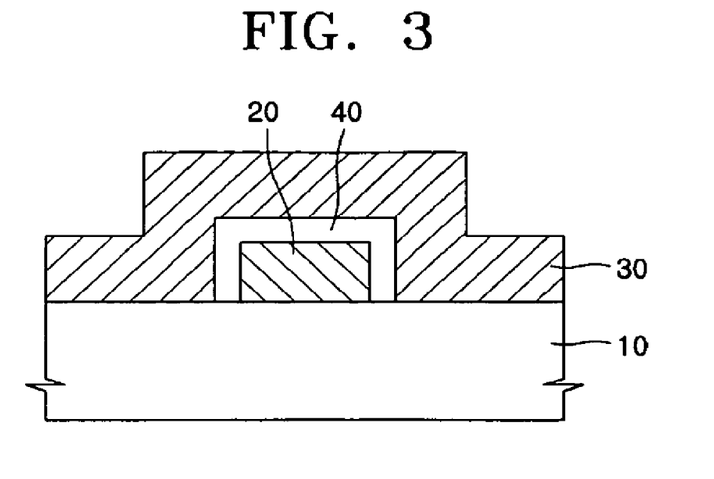
FIG. 3 is a cross-sectional view of essential parts of an electronic device according to an embodiment of the present invention.

FIG. 3 is a cross-sectional view of essential parts of an electronic device according to an embodiment of the present invention.

Referring to FIG. 3, the electronic device includes a first electrode 20 and a second electrode 30 formed on a substrate 10 and a self-assembled molecular layer 40 interposed between the first electrode 20 and the second electrode 30. The self-assembled molecular layer 40 is selectively immobilized on the first electrode 20 in a self-assembling manner. The self-assembled molecular layer 40 is composed of the compound having formula 1 described above.

The self-assembled molecular layer 40 may be composed of a single molecular layer, but may also be composed of a plurality of molecular layers layered in a self-assembling manner, if necessary. Each of the first electrode 20 and the second electrode 30 may be composed of metal, preferably gold.

The electronic device illustrated in FIG. 3 may constitute a memory device or a switching device according to the end of use.

Hereinafter, a method of synthesizing a compound for use in electronic devices according to an embodiment of the present invention and a method of manufacturing an electronic device according to an embodiment of the present invention will be described in more detail with reference to the following examples. These examples are provided for the purpose of illustration and are not intended to limit the scope of the present invention.

SYNTHESIS EXAMPLE 1

Synthesis Process 210 of FIG. 2

Figure 4:
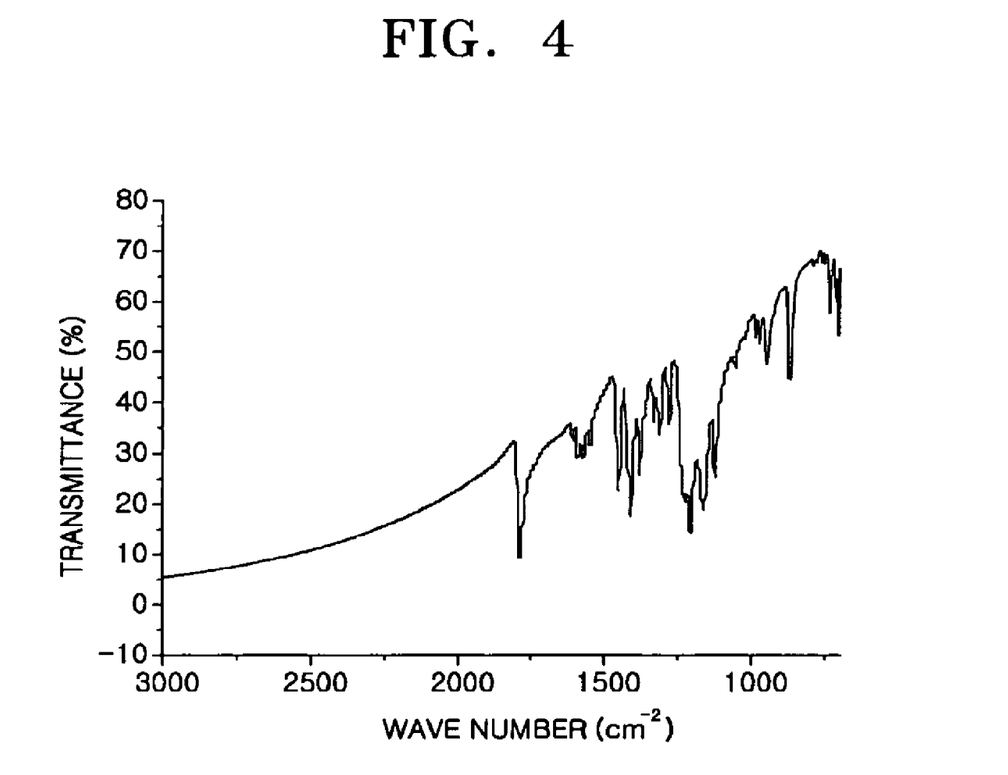
FIG. 4 is an FT-IR spectrum of an acyl chloride intermediate formed during a process of producing a compound according to an embodiment of the present invention.
Figure 5:
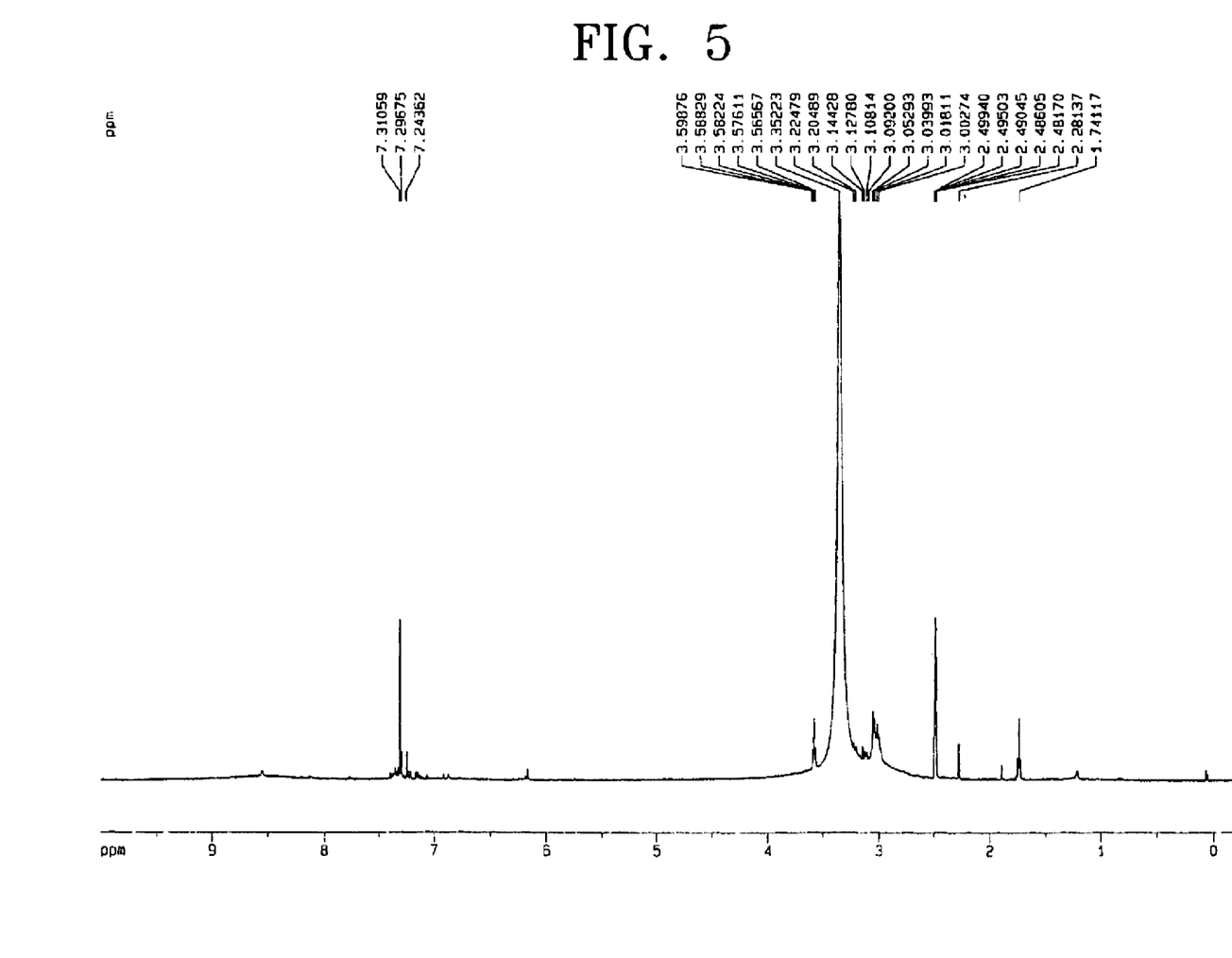
FIG. 5 is a $^1$H-NMR spectrum of a compound according to an embodiment of the present invention.
Figure 6:
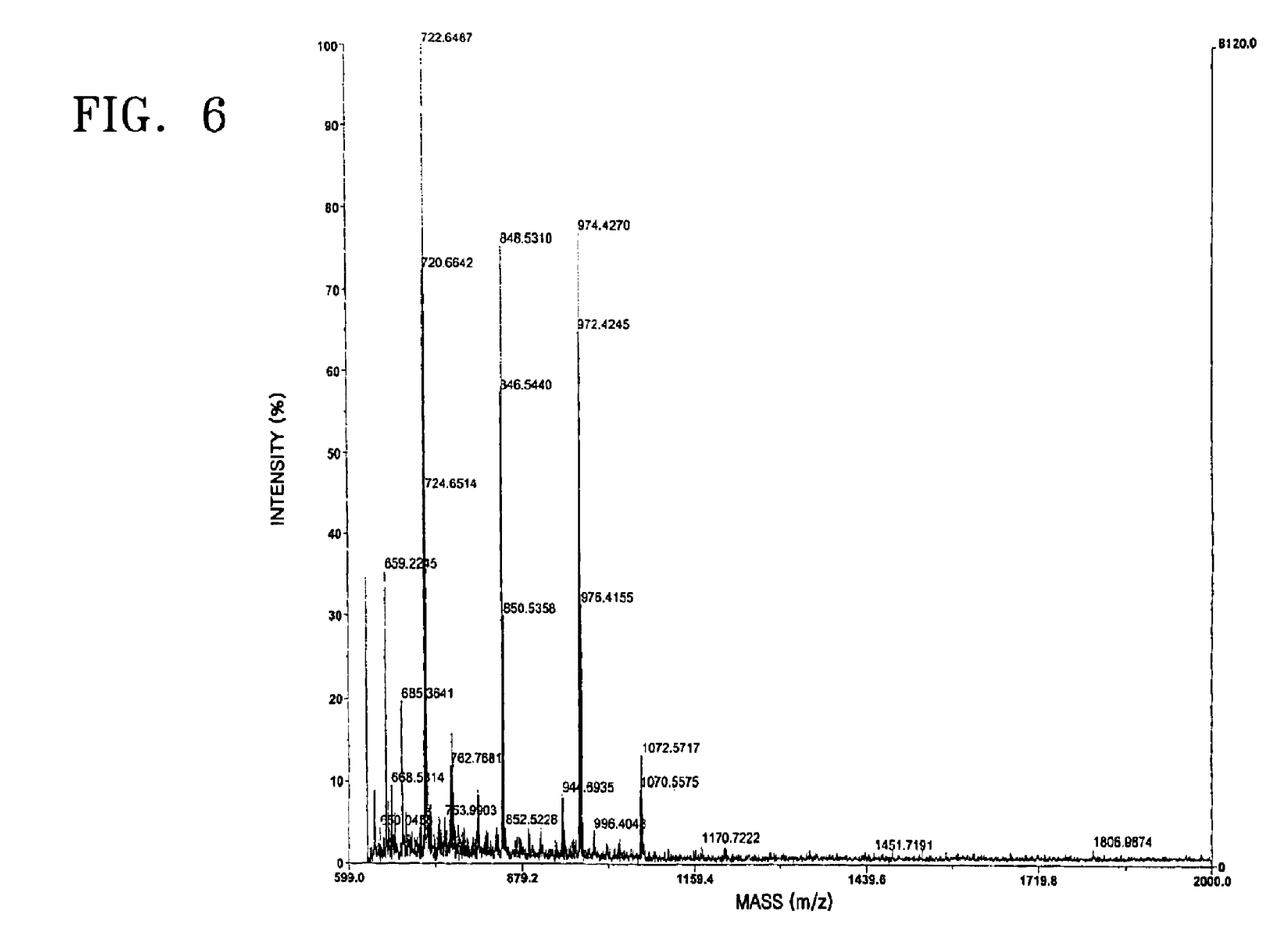
FIG. 6 is a mass spectrum (MALDI TOF) of a compound according to an embodiment of the present invention.
Figure 7:
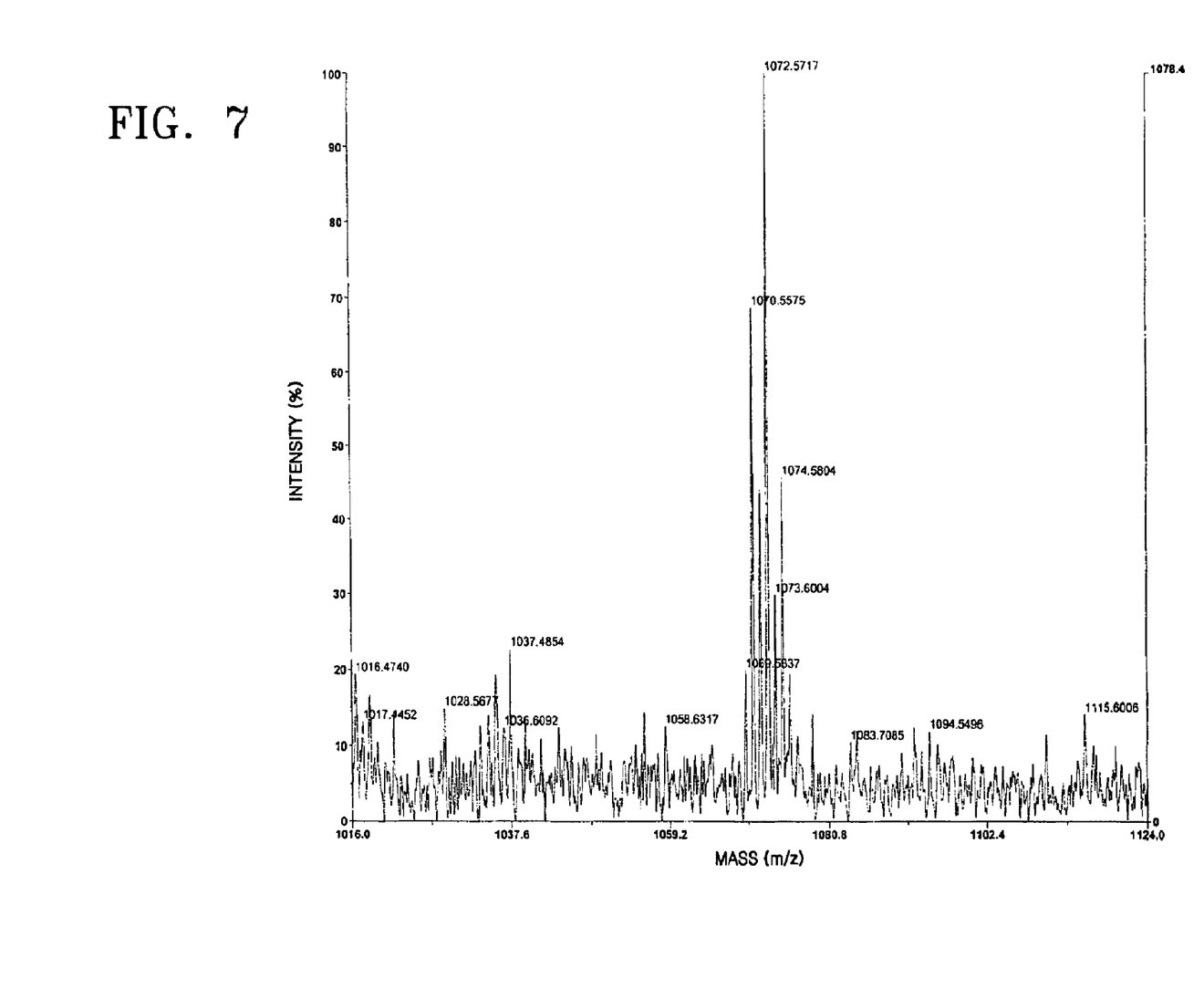
FIG. 7 is an enlarged view of the mass spectrum (MALDI TOF) illustrated in FIG. 6.
Figure 8:
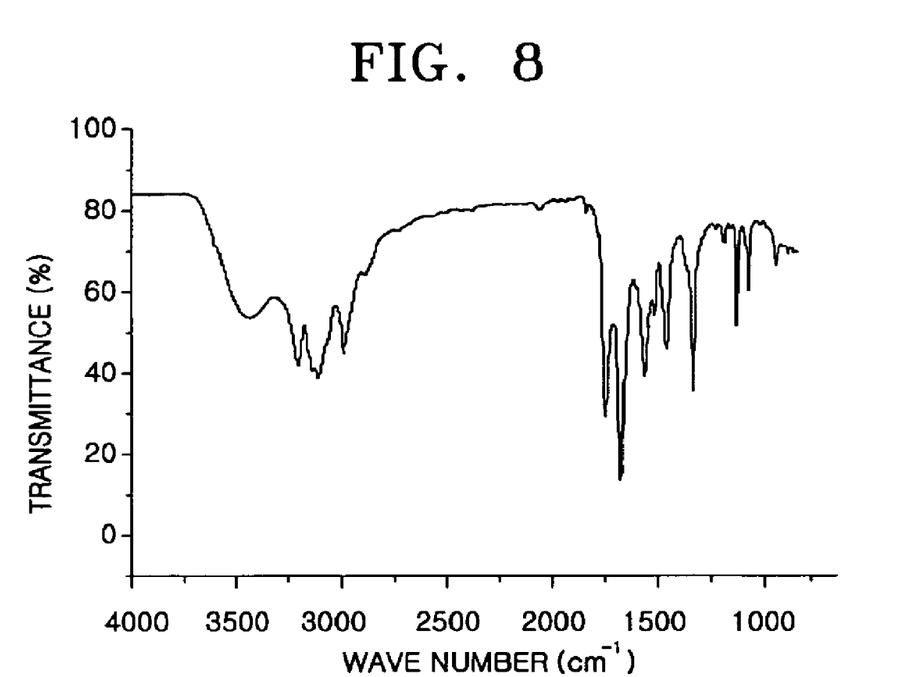
FIG. 8 is an FT-IR spectrum of a compound according to another embodiment of the present invention.

A 50 ml two-necked flask was flame-dried and cooled in a vacuum. Rose Bengal (1 g, 0.98 mmol) was placed in the flask and dried in a high vacuum. 20 ml of thionyl chloride ($SOCl_2$) was slowly added to the Rose Bengal and cooled, since, as soon as thionyl chloride ($SOCl_2$) was added, a reaction occurred, rapidly increasing the temperature. To efficiently remove hydrogen chloride generated during the reaction, a trap dipped in a basic solution was connected to the flask and nitrogen was continuously passed through the trap. After stirring the resultant mixed solution for about 2 days, the resultant product was confirmed using FT-IR and the reaction was stopped. An excess amount of thionyl chloride was removed under reduced pressure, and then the resultant product was dried in a vacuum. Thus, the acyl chloride intermediate 212 was obtained. The FT-IR spectrum of the acyl chloride intermediate 212 is shown in FIG. 4.

Compound 212; FT-IR (film) 1784.6, 1584.9, 1566.9, 1449.2, 1408.0, 1378.3, 1203.9, 1161.5, 1123.0 $cm^{-1}$

SYNTHESIS EXAMPLE 2

Synthesis Process 220 of FIG. 2

2-aminoethanthiol (0.24 g, 2.0 mmol, compound 213) was mixed with N,N-dimethyl-4-aminopyridine (0.22 g, 2.0 mmol) and an excess amount of pyridine was added to the mixture and stirred to obtain a solution. The obtained solution was transferred to the acyl chloride intermediate 212 produced in Synthesis example 1 using a metal tube, and then the mixture was stirred for about 2 days under a nitrogen atmosphere. Then, the resultant product was subjected to silica gel column chromatography using a dichloromethane-based solvent containing 25% diethyl ester to obtain the desired compound 216 in the form of a red solid (0.51 g, yield 50%). The compound 216 was confirmed using several analytic methods. The $^1$H-NMR spectrum, mass spectrum (MALDI-TOF), and FT-IR spectrum of the desired compound 216 were respectively shown in FIG. 5, FIGS. 6 and 7, and FIG. 8.

Compound 216; MS (M+K, MALDI-TOF): m/z (%):1072; FT-IR (film) 3411.9, 3165.8, 3064.7, 2941.6, 1639.2, 1567.2, 1449.4, 1341.5, 1209.8, 994.5, 938.8 $cm^{-1}$

SYNTHESIS EXAMPLE 3

Synthesis Process 230 in FIG. 2

The desired compound 217 was obtained in the form of a red solid (0.52 g, yield 49%) in the same manner as in Synthesis example 2, except that the aminoalkanethiol compound 214 (0.35 g, 2.0 mmol) was used instead of the aminoalkanethiol compound 213. The desired compound 217 was confirmed using mass spectrometry (MALDI-TOF)

Compound 217 (M+K, MALDI-TOF): m/z (%): 1128

SYNTHESIS EXAMPLE 4

Synthesis Process (240) of FIG. 2

The desired compound 218 was obtained in the form of a red solid (0.57 g, yield 50%) in the same manner as in Synthesis example 2, except that the aminoalkanethiol compound 215 (0.5 g, 2.0 mmol) was used instead of the aminoalkanethiol compound 213. The desired compound 218 was confirmed using mass spectrometry (MALDI-TOF).

Compound 218 (M+K, MALDI-TOF): m/z(%): 1198

Manufacturing Example (Manufacturing of an Electronic Device)

First, three lines of lower electrodes were formed by manufacturing a compound semiconductor using a general nano-imprinting technique. The lower electrodes were formed of gold. The line width of each of the lower electrodes were in a range of 20 nm-5 μm, and could be in a range of 20 nm-50 nm.

The desired compound 216 synthesized in Synthesis example 2 was immobilized on each of the lower electrodes using a self-assembling method. At this time, an anhydrous, oxygen-free dimethylformamide (DMF) was used as a solvent in a glove box maintained under an oxygen-free and dry atmosphere. A substrate on which the lower electrodes were formed was dipped in a 10 ml-solution containing the desired compound 216 in a concentration of 1 mmol in the DMF and was left for 24 hours. Then, the substrate was removed and washed sequentially with DMF, THF, ethanol, and distilled water. The washed molecular device was dried in a low-temperature vacuum oven (40° C., $10^{-3}$ torr) for at least 2 hours, and then placed in a deposition apparatus. Gold was deposited on the molecular device at $10^{-6}$ torr and −78° C.

EVALUATION EXAMPLE

Evaluation Of Switching/Memory Properties

Switching properties of the electronic device manufactured in the Manufacturing example were determined using a semiconductor parameter analyzer (HP 4156C) and memory properties of the electronic device were determined using a pulse generator unit (HP 41501 expander) and a source monitor unit/pulse generator unit (SMU-PGU) selector (HP 16440A).

The experiment conditions were as follows. First, to prevent oxidation of the molecules in the memory device manufactured in the manufacture examples, the memory device was stored in a vacuum chamber at room temperature before the analysis. Current-voltage characteristics were determined using a semiconductor parameter analyzer (HP 4156C, measurement range: 1fA/2V-1A/200V). The molecular switching/memory properties were determined in the same direction as and opposite direction to the voltage.

Figure 9:
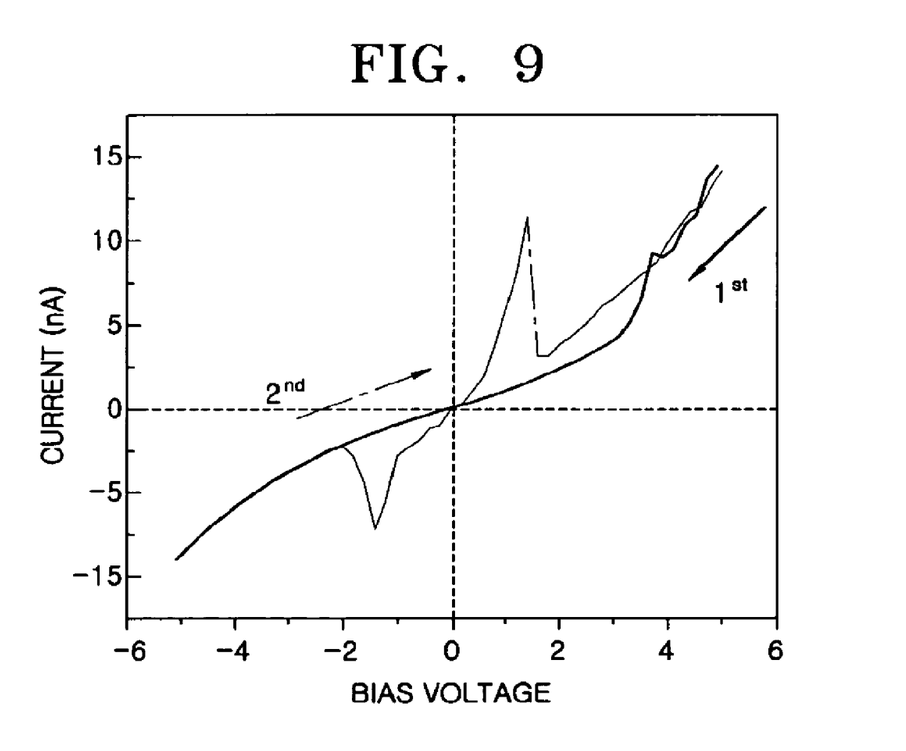
FIG. 9 is a graph of molecular switching (hysteresis) properties of an electronic device according to an embodiment of the present invention.

That is, the molecular switching/memory properties were determined from $+V_c$ voltage to $-V_c$ voltage, from $-V_c$ voltage to $+V_c$ voltage, and also in a voltage loop from 0 to $+V_c$ voltage to $-V_c$ voltage to $+V_c$ voltage. Thus, the switching properties of the device were confirmed, and the results are illustrated in FIG. 9.

Figure 10:
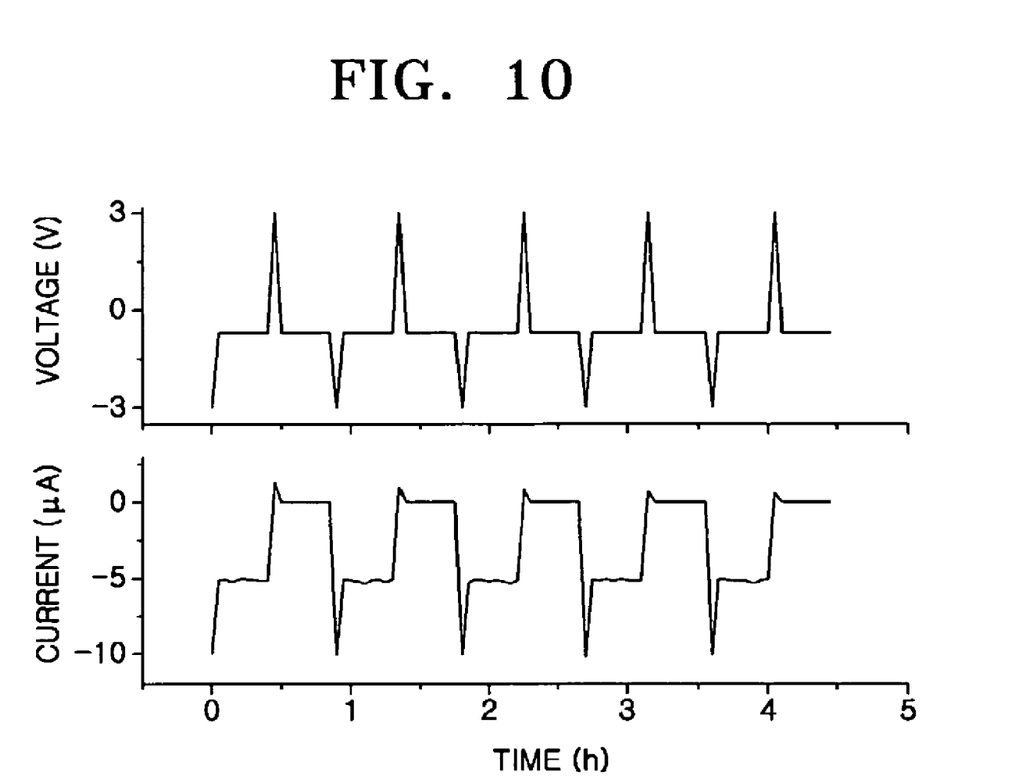
FIG. 10 is a graph of memory properties of an electronic device according to an embodiment of the present invention.

A pulse was measured using a pulse generator (HP 41501 expander) and an SMU-PGU selector (HP 16440A), which can be connected to the above apparatus for determining the switching properties, to evaluate the memory properties of the device. The results are illustrated in FIG. 10. In particular, the pulse generator, which has a measurement range of several Hz to several MHz, must be selected considering the switching properties of the molecular memory device rising/falling time of a voltage pulse had a period of 100 ns or less.

A compound for use in electronic devices according to the present invention is derived from Rose Bengal. The compound can be used to form a single molecular layer on an electrode in a self-assembling manner to realize a molecular switch/memory device. As opposed to a conventional thin film having a thickness of several tens of nanometers formed by a spin coating method, the compound according to the present invention can be used to form an active layer composed of a single molecular layer with an ultra-thin thickness of about several nanometers that can be controlled according to the length of a substituent of the compound. In particular, to introduce an anchoring group into Rose Bengal, the voltage between a lower electrode and an upper electrode can be controlled by varying the length and type of the substituent. Using an exemplary compound according to the present invention, the intensity of a current flowing through the single molecular layer can be controlled according to the length of an alkyl group. According to the present invention, an electronic device comprising the single molecular layer which is formed in the self-assembling manner with a thickness controlled by varying the length of the substituent has switching/memory properties. Thus, a practical molecular device can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A compound for use in electronic devices, having the following formula:

wherein

R is an unsaturated or saturated $C_2$-$C_{20}$ hydrocarbon group.

2. The compound of claim 1, wherein R is an alkyl group or an alkene group.

3. The compound of claim 1, having the following formula:

wherein n is an integer from 2 to 20.

4. A method of producing a compound for use in electronic devices, comprising:

reacting Rose Bengal having the following formula with thionyl chloride to obtain an acyl chloride intermediate; and coupling the acyl chloride intermediate with a thiol compound to obtain a compound having the following formula:

wherein

R is an unsaturated or saturated $C_2$-$C_{20}$ hydrocarbon group.

5. The method of claim 4, wherein the coupling the acyl chloride intermediate with the thiol compound is performed under a basic atmosphere.

6. The method of claim 4, wherein a pyridine-based solvent is used in the coupling of the acyl chloride intermediate with the thiol compound.

7. The method of claim 4, wherein the thiol compound is aminoalkanethiol.

8. An electronic device comprising:
a first electrode;
a self-assembled molecular layer composed of a compound having the following formula selectively immobilized on the first electrode by self-assembling; and
a second electrode formed on the self-assembled molecular layer, wherein R is an unsaturated or saturated $C_2$-$C_{20}$ hydrocarbon group.

9. The electronic device of claim 8, wherein the self-assembled molecular layer is composed of a single molecular layer.

10. The electronic device of claim 8, wherein the self-assembled molecular layer is composed of a plurality of molecular layers.

11. The electronic device of claim 8, constituting a memory device.

12. The electronic device of claim 8, constituting a switching device.

13. The electronic device of claim 8, wherein each of the first electrode and the second electrode are made of gold.

14. A method of manufacturing of an electronic device, comprising:

forming a first electrode on a substrate;
preparing a solution of a compound having the following formula dissolved in a solvent;
dipping the substrate having the first electrode formed thereon into the obtained solution to form a self-assembled molecular layer on the first electrode; and
forming a second electrode on the self-assembled molecular layer.

wherein

R is an unsaturated or saturated $C_2$-$C_{20}$ hydrocarbon group.

15. The method of claim 14, wherein the solvent is dimethylformamide (DMF).

16. The method of claim 14, wherein the preparing of the solution is performed under an oxygen-free anhydrous atmosphere.

* * * * *